United States Patent [19]

Huener et al.

[11] 3,855,549

[45] Dec. 17, 1974

[54] CIRCUIT, SUCH AS CMOS CRYSTAL OSCILLATOR, WITH REDUCED POWER CONSUMPTION

[75] Inventors: Robert Charles Huener, Bound Brook; Richard Plumb Fillmore, Plainfield, both of N.J.

[73] Assignee: RCA Corporation, New York, N.Y.

[22] Filed: Aug. 24, 1973

[21] Appl. No.: 391,357

[52] U.S. Cl. ............ 331/108 D, 307/205, 307/213, 307/214, 331/116 R

[51] Int. Cl. ............ H03b 5/36

[58] Field of Search ........ 331/108 A, 108 C, 108 D, 331/116 R, 117 R; 307/205, 213, 214, 304; 330/35

[56] References Cited

UNITED STATES PATENTS

| | | | |
|---|---|---|---|
| 3,664,118 | 5/1972 | Walton | 331/116 R X |
| 3,676,801 | 7/1972 | Musa | 331/116 R |
| 3,725,822 | 4/1973 | Eaton, Jr. | 331/116 R X |

*Primary Examiner*—Siegfried H. Grimm
*Attorney, Agent, or Firm*—H. Christofferson; S. Cohen

[57] ABSTRACT

A complementary symmetry, metal oxide semiconductor device (COS/MOS) oscillator which includes a COS/MOS inverter and a regenerative feedback path from the output to the input terminal of the inverter. Power consumption is reduced, when current flow through the one device tends to increase, by applying regenerative feedback to an impedance in series with the other device to more quickly drive the other device to cut off, and vice versa. Degeneration across the impedances, when current flow therethrough tends to increase, also is employed to reduce power consumption.

26 Claims, 8 Drawing Figures

CIRCUIT, SUCH AS CMOS CRYSTAL OSCILLATOR, WITH REDUCED POWER CONSUMPTION

In small, portable electronic instruments, such as electronic wrist watches, the self-contained power supply, which may be a small, single cell battery, is of limited capacity. It is therefore important to design the circuits in such a way that power consumption is minimized. In such instruments which are used for timing purposes, an oscillator is employed as the central time base. As it runs continuously, it often represents the highest percentage of power dissipation in the instrument. The present invention relates to an oscillator of improved design suitable for these applications.

Figure 1:
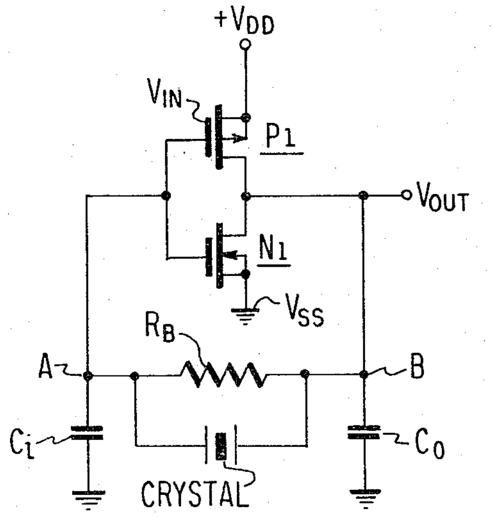
PRIOR ART Fig. 1.
FIGS. 1–3 represent known oscillators.
Figure 4:
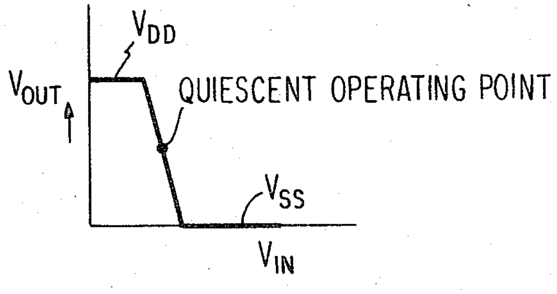
FIG. 4 is a graph of input versus output voltage for a COS/MOS inverter.

The known crystal controlled oscillator of FIG. 1 includes a P type metal oxide semiconductor (MOS) device $P_1$ and an N type MOS device $N_1$. The conduction paths of these two devices are connected in series between two operating voltage terminals $+V_{DD}$ and $V_{SS}$, where $V_{DD}$ may be a positive voltage terminal and $V_{SS}$ ground. A feedback path extends between the output terminal $V_{out}$ and the input terminal $V_{in}$ at the connected gate electrodes. This path includes a feedback resistor $R_B$ chosen to place the quiescent operating point in the linear portion of the operating characteristic of the series connected devices. This characteristic, shown in FIG. 4, is that of a COS/MOS inverter such as $P_1$ and $N_1$. In general, the operating point is selected such that $V_{in} = V_{out}$ and in one particular design may be in the range of, say, 0.3 $V_{DD}$ to 0.7 $V_{DD}$, with nominal value $V_{in} = V_{out} = 0.5V_{DD}$, where $V_{SS} = 0$.

A quartz crystal is connected across the feedback resistor and two capacitors $C_i$ and $C_o$ are also in the feedback loop. These capacitors are lumped elements and one, $C_i$, is connected between terminal A and ground and the other, $C_o$, is connected between terminal B and ground. These capacitors, which may be adjustable trimming capacitors, are chosen to match the internal capacitances of the crystal in a well known fashion. The various elements are chosen to obtain a feedback loop gain of greater than one and a phase shift such that the feedback is regenerative. This satisfies the criteria for stable oscillation.

Figure 8:
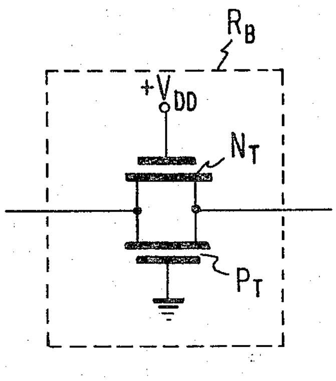
FIG. 8 is a schematic drawing of a feedback resistor suitable for use in the various circuits which are illustrated.

The circuit of FIG. 1 is an integrated circuit. With the exception of the crystal, and two capacitors and, at present, the resistor $R_B$, all of the devices are integrated onto a common substrate. In a preferred design, it is expected that the resistor $R_B$ will be an integrated circuit element such as the dual transmission gate shown in FIG. 8, forward biased as shown, and with the conduction path lengths and widths chosen to obtain the quiescent operating point as shown in FIG. 4.

In the operation of the circuit of FIG. 1, the circuit swings between output voltage levels $V_{DD}$ and $V_{SS}$. As current increases through $P_1$, the feedback signal causes the conduction through transistor $P_1$ to increase and the conduction through transistor $N_1$ to decrease.

When conduction through $P_1$ reaches its maximum value and starts to decrease, feedback continues to be regenerative, driving transistor $P_1$ to the cut-off state and transistor $N_1$ to the conducting state.

During a portion of each cycle, current flows through both devices $P_1$ and $N_1$. This flow of current is wasted power. The only useful power consumed during the operation is that flowing from transistor $P_1$, acting as a source of current, and into the feedback loop and output terminal, and that flowing from the feedback loop and output terminal into transistor $N_1$, acting as a current sink. In other words, the most efficient operation of the circuit of FIG. 1 is that which occurs when all of the current passing through transistor $P_1$ flows either to the output terminal or the feedback loop and none of this current flows into transistor $N_1$, and when all of the current flowing into transistor $N_1$ comes from the feedback loop and output terminal, none of this current coming from transistor $P_1$.

In a practical circuit as shown in FIG. 1, the power supply is a small battery, as already mentioned. Power dissipation, that is, wasted power of the type discussed above increases rapidly as the difference between the voltage and the sum of the threshold voltages of the P and N devices ($V_{TP} + V_{TN}$) increases. This has been found to to be the case empirically. Thus, THus, if the supply voltage should remain at a fixed value and the sum ($V_{TP} = V_{TN}$) decreases, the power consumption will increase. Similarly, in a plurality of different circuits where there are unit-to-unit variations in ($V_{TP} + V_{TN}$), those circuits where $V_{DD} - (V_{TP} + V_{TN})$ is greatest have the highest power dissipation. In other words, because of differences unit-to-unit among the threshold voltages of the various P devices and among the various N devices, the power dissipation of an oscillator such as shown in FIG. 1 may vary from one oscillator to the next. Variations in such parameters as the MOS device conductive channel widths and the MOS device threshold voltages, from one integrated circuit to another, also can result in an increase in the wasted power.

It is also the case that the sum ($V_{TN} + V_{TP}$) must be designed, in some applications (i.e., a timepiece), for the circuit to continue to oscillate until the battery comes to the end of its useful life. This means that in the initial design of an oscillator, the worst case sum ($V_{TN} + V_{TP}$), that is, the maximum sum, any pair of MOS devices is expected to have, must be chosen to be less than the battery voltage which is present at the end of the useful life of the battery. The remaining units, that is, the oscillators built with MOS devices whose initial ($V_{TN} + V_{TP}$) is smaller than the worst case value, will therefore initially dissipate more power than the oscillators built with worst case MOS devices and will wear out their batteries in a shorter time than the oscillators with the worst case MOS devices.

Figure 2:
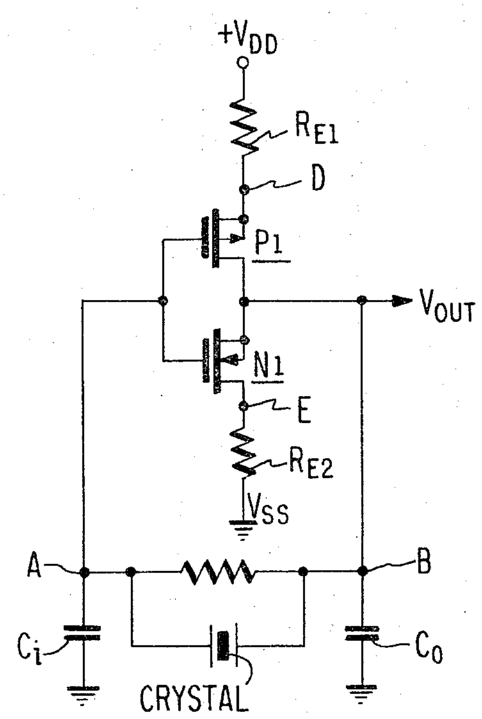
Fig. 2. PRIOR ART
Figure 3:
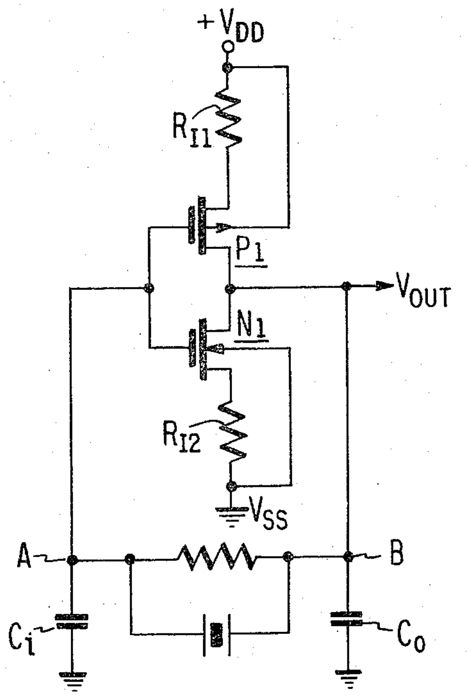
Fig. 3. PRIOR ART

The power dissipation of the circuit of FIG. 1 can be decreased by incorporating resistors in series with the conduction paths in the manner shown in FIGS. 2 and 3. In FIGS. 2, the resistors $R_{E1}$ and $R_{E2}$ are external of the integrated circuit, that is, external of the "chip." In FIG. 3, the resistors are integrated circuit resistors on the chip. The resistors provide current limiting in two ways. First, the added impedance in the respective conduction paths reduces the current flow. Second, as the current through the conduction path of a device increases, the voltage drop across the resistor connected thereto increases and this limits the voltage drop across the device. This degenerative feedback limits the current flow through that device.

An advantage of the configuration shown in FIG. 2, is that the resistors can be made very close to the precise value called for by a particular design, with little variation (say, 5 to 10 percent or less) from resistor to resistor. Alternatively, where there are variations unit-to-unit among the oscillators of a factory run, the resistors can be tailored to compensate for such variations, that is, to optimize power dissipation and oscillator stability. However, the FIG. 2 circuit does have a number of disadvantages. One is that two "pins" or "bonding pads" D and E on the chip, in addition to the pins A and B, are needed to permit connection of the external resistors. In an integrated circuit of the type under discussion, the oscillator shown may be only one of several circuits on the chip and it is important to minimize the number of pins required for this one circuit. The reason is that the number of pins on the entire chip is limited to some standard value, such as sixteen, and if four of these pins rather than two are needed for the oscillator, this may mean that some circuit performing another function may have to be omitted from the chip. A second disadvantage of the FIG. 2 circuit is that the resistors are external, which means increased costs, and if resistor selection is required, this means even greater costs. Finally, in some systems, such as in wrist watches, it is important to reduce the volume of the circuit as much as possible and added external components add to the bulk.

The important advantage of the FIG. 3 circuit is that its cost is not greatly different than that of the FIG. 1 circuit, as the resistors are fabricated by the same process as and during the same time as the remaining circuitry. Further, as in the FIG. 1 circuit, only two external pins A and B (aside from the operating voltage terminals) are needed. However, the circuit of FIG. 3 does not operate as well as the circuit of FIG. 2 because it is very difficult to control the values of the internal resistors. Three to one variations in resistor size from chip to chip are found to occur.

Figure 5:
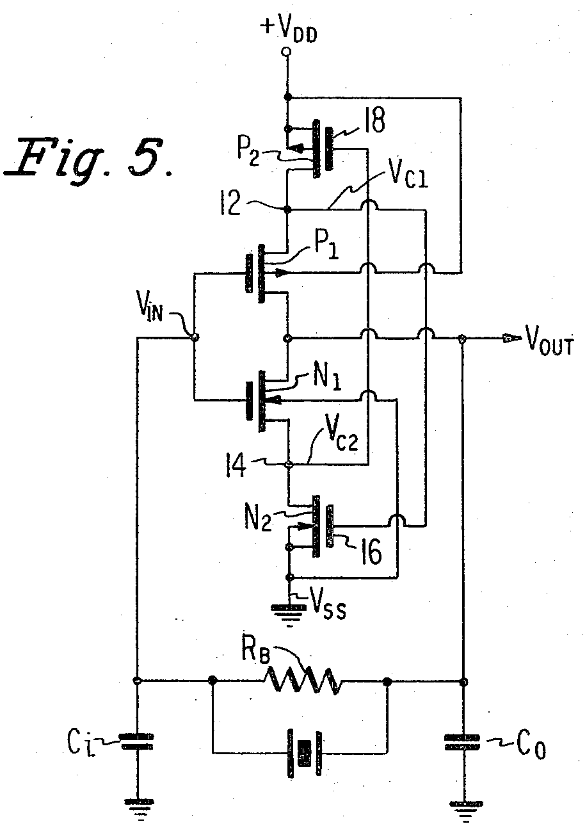
FIGS. 5–7 are schematic drawings of three different embodiments of the invention.

An embodiment of the present invention is illustrated in FIG. 5. A controllable impedance means, P-type transistor $P_2$, is connected with its conduction path in series with transistor $P_1$. A second controllable impedance means, N-type transistor $N_2$, is connected with its conduction path in series with transistor $N_1$. The control or gate electrode 18 of transistor $P_2$ connects to node 14 at the connection of the conduction paths of transistors $N_1$ and $N_2$ (the connection of the drain electrode of transistor $N_2$ to the source electrode of transistor $N_1$). The control electrode 16 of transistor $N_2$ connects to node 12 at the connection of the conduction paths of transistors $P_1$ and $P_2$.

Assume that initially the voltage $V_{in}$ is decreasing (getting closer to $V_{SS}$) so that the impedance of the conduction path of device $P_1$ starts to decrease. This increases the current flow through devices $P_1$ and $P_2$. As the current through device $P_2$ increases, the voltage drop across this device, that is, between its source and drain electrodes, increases. As this voltage increases, $V_{C1}$, the voltage at node 12, gets lower (reduces in value toward $V_{SS}$). This voltage $V_{C1}$ is applied as a control signal to the gate electrode 16 of transistor $N_2$. This signal is of a sense to increase the impedance of the conduction path of transistor $N_2$. This reduces the current flow through transistors $N_1$ and $N_2$.

During the second half of each operating cycle, the feedback to the control electrodes 18 and 16 operates in similar but opposite fashion. As $V_{in}$ increases, transistor $N_1$ starts to conduct. The current flowing through transistor $N_1$ flows also through transistor $N_2$ increasing the voltage drop across transistor $N_2$. The voltage $V_{C2}$ at node 14 now increases and this, applied to the gate electrode of transistor $P_2$, causes its conduction channel impedance to increase. This reduces current flow through transistors $P_1$ and $P_2$.

Summarizing the above, in the circuit of FIG. 5 any time the current through transistor $P_1$, acting as a source, tends to increase, an impedance ($N_2$) in series with transistor $N_1$ increases, reducing wasted power through transistor $N_1$. Similarly, any time the current through transistor $N_1$, acting as a sink, increases, an impedance $P_2$ in series with transistor $P_1$ is increased, reducing wasted power through transistor $P_1$.

The added transistors $P_2$ and $N_2$ also provide improved performance of the type discussed in connection with FIGS. 2 and 3. As transistor $P_1$ draws more current and as transistor $P_2$ correspondingly draws this same additional current, the voltage drop across the transistor $P_2$ increases. This reduces the drive voltage available for transistor $P_1$ so that the current flow through transistor $P_1$ is limited to a lower value.

Summarizing the above, when current flow from $V_{DD}$ to $V_{SS}$ tends to increase due to variations among oscillator circuit parameters from unit-to-unit, and/or variations in supply voltage, the current limiting properties of transistors $N_2$ and $P_2$ tend to reduce and stabilize the power dissipation. By appropriate selection of the device geometries, that is, the length and width of the respective conduction channels, the degree of feedback can be increased or decreased to satisfy various design requirements such as the operating voltage range expected, the range of device threshold voltages expected, and so on.

Figure 6:
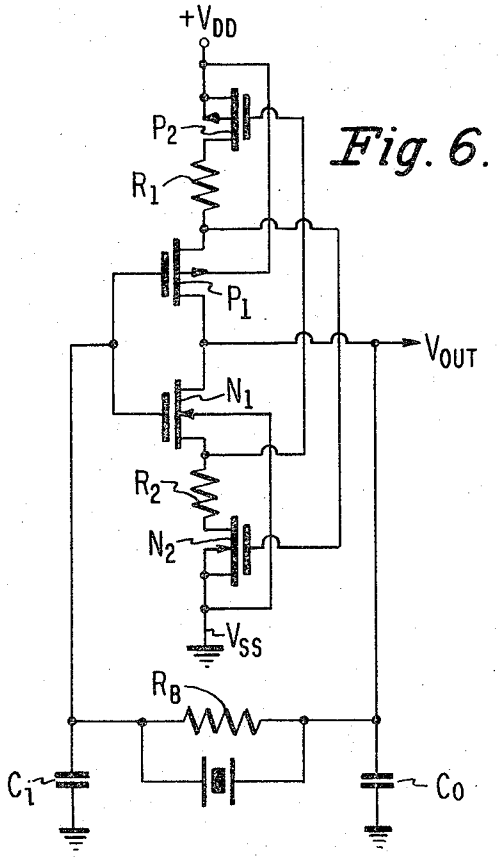
Figure 7:
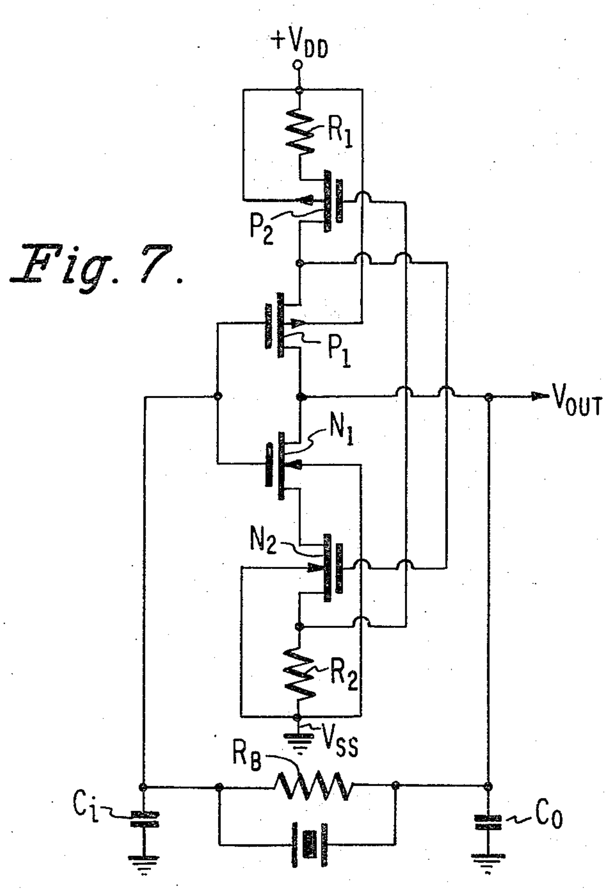

The circuits of FIGS. 6 and 7 are variations of the circuit of FIG. 5. In the circuit of FIG. 6, resistor $R_1$ is located between the conduction paths of transistors $P_1$ and $P_2$ and resistor $R_2$ is located between the conduction paths of transistors $N_1$ and $N_2$. In FIG. 7, resistor $R_1$ is connected between the $+V_{DD}$ terminal and the source electrode of transistor $P_2$ and resistor $R_2$ is connected between the $V_{SS}$ terminal (ground) and the source electrode of transistor $N_2$. These circuits operate in the same way as the FIG. 5 circuit; however, the additional resistors provide additional degenerative feedback and thus additional stabilization of the oscillator circuit. The resistors $R_1$ and $R_2$ may be integrated circuit resistors. As one example, they may be diffused P well transistors. As another, $R_1$ may be a P type MOS device connected at its gate electrode to $V_{SS}$ and $R_2$ may be an N type MOS device connected at its gate electrode to $+V_{DD}$. By proper choice of conduction channel length and width, the desired value of resistance may be obtained.

The problem of reproducing resistor values from one circuit to another discussed in connection with FIGS. 3 is also present in the circuits of FIGS. 6 and 7. However, it has been found empirically that the feedback, in some way which is not fully understood, as yet, reduces the effect of such variations. Thus, a circuit such as shown in FIG. 6 has less variation in power dissipation from one unit to the next than the circuit of FIG.

5 even though the resistors $R_1$ and $R_2$ may vary from unit-to-unit over a range of four to one.

What is claimed is:

1. An oscillator comprising, in combination:
first and second controllable impedance means;
two operating voltage terminals;
an input terminal;
an output terminal;
first and second semiconductor devices of different conductivity types, each having a conduction path and a control electrode for controlling the conductivity of its conduction path, both control electrodes connected to said input terminal, the conduction path of said first device connected in series with said first controllable impedance means between said output terminal and one operating voltage terminal and the conduction path of said second device connected in series with said second controllable impedance means between said output terminal and the other operating voltage terminal;
a regenerative feedback path connected between said output terminal and said input terminal; and
second and third feedback paths, the second coupled between said first device and said second controllable impedance means and the third coupled between said second device and said first controllable impedance means.

2. An oscillator as set forth in claim 1 wherein said first and second controllable impedance means comprise third and fourth semiconductor devices, each having a conduction path and a control electrode for controlling the conductivity of its path, said third device of the same conductivity as the first device and the conduction path of said third device connected in series with that of said first device, said fourth device of the same conductivity type as said second device and the conduction path of said fourth device connected in series with that of said second device, said second feedback path connected to the control electrode of said fourth device and said third feedback path connected to the control electrode of said third device.

3. In an oscillator as set forth in claim 1, said regenerative feedback path including a crystal for controlling the frequency of said oscillator.

4. An oscillator as set forth in claim 1, wherein said first and second semiconductor devices comprise P and N type metal oxide semiconductor devices, respectively.

5. An oscillator as set forth in claim 1, further including first resistive means in series with the conduction path of said first device and second resistive means in series with the conduction path of said second device.

6. In an oscillator as set forth in claim 1, said first device comprising a P type device and said second device an N type device, each device having a source electrode at one end of its conduction path and a drain electrode at the other end of its conduction path, said second feedback path being connected at one end to the source electrode of said P type device and said third feedback path being connected at one end to the source electrode of said N type device.

7. An oscillator comprising, in combination:
two controllable impedance means;
two operating voltage terminals;
an output terminal;
an input terminal;
two semiconductor devices of different conductivity types, each having a conduction path and a control electrode for controlling the conductivity of its conduction path, both control electrodes connected to said input terminal, the conduction path of one device connected in series with one controllable impedance means between said output terminal and one operating voltage terminal and the conduction path of the other device connected in series with the other controllable impedance means between said output terminal and the other operating voltage terminal;
a regenerative feedback path connected between said output terminal and said input terminal;
means responsive to increased current flow through one device for increasing the impedance of the controllable impedance means in series with the conduction path of the other device; and
means responsive to increased current flow through the other device for increasing the impedance of the controllable impedance means in series with the conduction path of said one device.

8. A COS/MOS oscillator comprising, in combination:
first and second operating voltage terminals;
an input terminal and an output terminal;
four MOS transistors, the first and second of P type and the third and fourth of N type, each having a conduction path and a control electrode, the control electrode of the second and third transistors connected to said input terminal, the conduction paths of the P type transistors connected in series between said output terminal and said first operating voltage terminal and the conduction paths of the N type transistors connected in series between said output terminal and said second operating voltage terminal;
a regenerative feedback path connected between said output and input terminals;
a feedback connection responsive to current flow through the P type transistors connected to the control electrode of said fourth transistor; and
a feedback connection responsive to current flow through said N type transistors connected to the control electrode of said first transistor.

9. A COS/MOS oscillator as set forth in claim 8 wherein said regenerative feedback path includes a crystal for controlling the frequency of said oscillator.

10. A COS/MOS oscillator as set forth in claim 9 further including two resistor means, one in series with the conduction paths of the P type transistors and the other in series with the conduction paths of the N type transistor.

11. A COS/MOS oscillator as set forth in claim 10, one said resistor means being connected between the conduction paths of the P type transistors and the other resistor means being connected between the conduction paths of the N type transistors.

12. A COS/MOS oscillator as set forth in claim 10, one of said resistor means being connected between said one operating voltage terminal and the conduction paths of said P type transistors and the other resistor means being connected between the other operating voltage terminal and the conduction paths of said N type transistors.

13. A COS/MOS oscillator as set forth in claim 8 wherein one feedback connection is connected between the two P type transistors and senses current flow by sensing the voltage across one of said P type transistors and wherein the other feedback connection is connected between the two N type transistors and senses current flow by sensing the voltage across one of said N type transistors.

14. An oscillator comprising, in combination:
two controllable impedance means;
two operating voltage terminals;
an output terminal;
an input terminal;
two semiconductor devices of different conductivity types, each having a conduction path and a control electrode for controlling the conductivity of its conduction path, both control electrodes connected to said input terminal, the conduction path of one device connected in series with one controllable impedance means between said output terminal and one operating voltage terminal and the conduction path of the other device connected in series with the other controllable impedance means between said output terminal and the other operating voltage terminal;
a regenerative feedback path connected between said output terminal and said input terminal;
means responsive to the tendency for increased current flow through one device for controlling the impedance of the controllable impedance means in series with the conduction path of said one device; and
means responsive to the tendency for increased current flow through the other device for controlling the impedance of the controllable impedance means in series with the conduction path of said other device.

15. An oscillator as set forth in claim 14 wherein said two semiconductor devices comprise P and N type MOS transistors, respectively.

16. An oscillator as set forth in claim 15 wherein said two controllable impedance means also comprise P and N type MOS transistors, respectively, the conduction paths of the two P type transistors being connected in series between said output terminal and the one operating voltage terminal.

17. An oscillator as set forth in claim 16 wherein said two means responsive to the tendency for increased current flow comprise a feedback connection from a point in the circuit between said two P type transistors to the control electrode of said N type transistor operating as a controllable impedance means and a second feedback connection from a point in the circuit between said two N type transistors to the control electrode of the P type transistor operating as a controllable impedance means.

18. An oscillator comprising, in combination:
first and second operating voltage terminals;
an input terminal;
an output terminal;
first and second semiconductor devices of different conductivity types, each having a conduction channel and a control electrode for controlling the conductivity of its conduction channel, both control electrodes connected to said input terminal,
a first path between said output terminal and said first operating voltage terminal, said path including the conduction channel of said first device;
a second path between said output terminal and said second operating voltage terminal, said second path including the conduction channel of said second device;
a regenerative feedback path connected between said output terminal and said input terminal;
means responsive to the tendency for current flow through said first path to increase for increasing the impedance of said second path; and
means responsive to the tendency for current flow through said second path to increase for increasing the impedance of said first path.

19. An oscillator comprising, in combination:
first and second operating voltage terminals;
an input terminal;
an output terminal;
first and second semiconductor devices of different conductivity types, each having a conduction channel and a control electrode for controlling the conductivity of its conduction channel, both control electrodes connected to said input terminal,
a first path between said output terminal and said first operating voltage terminal, said path including the conduction channel of said first device;
a second path between said output terminal and said second operating voltage terminal, said second path including the conduction channel of said second device;
a regenerative feedback path connected between said output terminal and said input terminal;
means responsive to increased current flow in said first path and decreased current flow in said second path for applying regenerative feedback from said first to said second path; and
means responsive to increased current flow in said second path and decreased current flow in said first path for applying regenerative feedback from said second to said first path.

20. In combination:
first and second controllable impedance means;
two operating voltage terminals;
an input terminal;
an output terminal;
first and second semiconductor devices of different conductivity types, each having a conduction path and a control electrode for controlling the conductivity of its conduction path, both control electrodes connected to said input terminal, the conduction path of said first device connected in series with said first controllable impedance means between said output terminal and one of said operating voltage terminals and the conduction path of said second device connected in series with said second controllable impedance means between said output terminal and the other operating voltage terminal; and
first and second feedback paths, the first coupled between said first device and said second controllable impedance means and the second coupled between said second device and said first controllable impedance means.

21. The combination as set forth in claim 20 wherein said first and second controllable impedance means comprise third and fourth semiconductor devices, each having a conduction path and a controll electrode for controlling the conductivity of its path, said third device of the same conductivity as the first device and the conduction path of said third device connected in series with that of said first device, said fourth device of the same conductivity type as said second device and the conduction path of said fourth device connected in series with that of said second device, said first feedback path connected to the control electrode of said fourth device and said second feedback path connected to the control electrode of said third device.

22. The combination as set fourth in claim 20, wherein said first and second semiconductor devices comprise P and N type metal oxide semiconductor devices, respectively.

23. In the combination as set forth in claim 20, said first device comprising a P type device and said second device an N type device, each device having a source electrode at one end of its conduction path and a drain electrode at the other end of its conduction path, said first feedback path being connected at one end to the source electrode of said P type device and said second feedback path being connected at one end to the source electrode of said N type device.

24. A COS/MOS circuit comprising, in combination:

first and second operating voltage terminals;

an input terminal and an output terminal;

four MOS transistors, the first and second of P type and the third and fourth of N type, each having a conduction path and a control electrode, the control electrode of the second and third transistors connected to said input terminal, the conduction paths of the P type transistors connected in series between said output terminal and said first operating voltage terminal and the conduction paths of the N type transistors connected in series between said output terminal and said second operating voltage terminal;

a feedback connection responsive to current flow through the P type transistors connected to the control electrode of said fourth transistor; and a feedback connection responsive to current flow through said N type transistors connected to the control electrode of said first transistor.

25. A COS/MOS circuit as set forth in claim 24, further including two resistor means, one in series with the conduction paths of the P type transistors and the other in series with the conduction paths of the N type transistors.

26. A COS/MOS circuit as set forth in claim 24 wherein one feedback connection is connected between the two P type transistors and senses current flow by sensing the voltage across one of said P type transistors and wherein the other feedback connection is connected between the two N type transistors and senses current flow by sensing the voltage across one of said N type transistors.

* * * * *